(12) United States Patent
Strandjord et al.

(10) Patent No.: US 11,002,544 B2
(45) Date of Patent: May 11, 2021

(54) RFOG RESONANCE HOPPING

(71) Applicant: Honeywell International Inc., Morris Plains, NJ (US)

(72) Inventors: Lee K. Strandjord, Tonka Bay, MN (US); Marc Smiciklas, Phoenix, AZ (US); Jianfeng Wu, Tucson, AZ (US); Glen A. Sanders, Scottsdale, AZ (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/734,038

(22) Filed: Jan. 3, 2020

(65) Prior Publication Data
US 2021/0025708 A1 Jan. 28, 2021

Related U.S. Application Data

(60) Provisional application No. 62/879,344, filed on Jul. 26, 2019.

(51) Int. Cl.
*G01C 19/72* (2006.01)
*G01C 19/66* (2006.01)
(Continued)

(52) U.S. Cl.
CPC ........... *G01C 19/661* (2013.01); *G01C 19/64* (2013.01); *G01C 19/72* (2013.01); *G01C 19/721* (2013.01);
(Continued)

(58) Field of Classification Search
CPC .... G01C 19/661; G01C 19/721; G01C 19/64; G01C 19/72; H01S 3/1305; H01S 3/23; H01S 3/08013
See application file for complete search history.

(56) References Cited

U.S. PATENT DOCUMENTS 4,863,272 A * 9/1989 Coccoli ............... G01C 19/727
356/461
5,450,198 A 9/1995 Killpatrick et al.
(Continued)

FOREIGN PATENT DOCUMENTS

EP 3173742 A1 5/2017

OTHER PUBLICATIONS

European Patent Office, "Extended European Search Report from EP Application No. 20186815.5", from Foreign Counterpart to U.S. Appl. No. 16/734,038, dated Jan. 14, 2021, pp. 1 through 7, Published: EP.

*Primary Examiner* — Jonathan M Hansen
(74) *Attorney, Agent, or Firm* — Fogg & Powers LLC

(57) ABSTRACT

Systems and methods for performing resonator fiber optic gyroscope (RFOG) resonance hopping are described herein. For example, an RFOG includes a fiber optic resonator. The RFOG also includes a plurality of laser sources that each launch a respective laser for propagation within the fiber optic resonator. Further, the RFOG includes a threshold detector that determines when the operation of at least one laser source in the plurality of laser sources exceeds a threshold associated with the operational range of an aspect of the at least one laser source. Additionally, the RFOG includes a hop control logic that adjusts the frequency of at least one laser produced by the at least one laser source one or more resonant modes of the fiber optic resonator such that the aspect of the at least one laser moves away from the threshold towards a nominal value within the operational range.

20 Claims, 4 Drawing Sheets

(51) Int. Cl.
   *H01S 3/13*    (2006.01)
   *H01S 3/23*    (2006.01)
   *H01S 3/08*    (2006.01)
   *G01C 19/64*   (2006.01)

(52) U.S. Cl.
   CPC ........ *H01S 3/08013* (2013.01); *H01S 3/1305* (2013.01); *H01S 3/23* (2013.01)

(56) References Cited

U.S. PATENT DOCUMENTS

| | | |
|---|---|---|
| 9,772,189 B2 | 9/2017 | Strandjord et al. |
| 2003/0026302 A1 | 2/2003 | Anthon et al. |
| 2010/0014092 A1 | 1/2010 | Fellows et al. |
| 2011/0141477 A1 | 6/2011 | Sanders et al. |
| 2014/0240712 A1 | 8/2014 | Strandjord et al. |
| 2015/0288135 A1* | 10/2015 | Qiu ..................... G01C 19/727 372/28 |
| 2016/0334217 A1 | 11/2016 | Strandjord et al. |

* cited by examiner

RFOG RESONANCE HOPPING

CROSS-REFERENCE TO RELATED APPLICATION

This application claims the benefit of U.S. Provisional Application Ser. No. 62/879,344, filed Jul. 26, 2019, and titled "RFOG RESONANCE HOPPING," which is hereby incorporated herein by reference.

BACKGROUND

Gyroscopes (also referred to herein as gyros) have been used to measure rotation rates or changes in angular velocity about an axis of rotation. A basic conventional fiber optic gyro (FOG) includes a light source, a beam generating device, and a coil of optical fiber coupled to the beam generating device that encircles an area. The beam generating device transmits light beams into the coil that propagate in a clockwise (CW) direction and a counter-clockwise (CCW) direction along the core of the optical fiber. Many FOGs utilize glass-based optical fibers that guide light along a solid glass core of the fiber. The two counter-propagating (e.g., CW and CCW) beams experience different pathlengths while propagating around a rotating closed optical path, and the difference in the two pathlengths is proportional to the rotational rate that is normal to the enclosed area.

In a resonator fiber optic gyroscope (RFOG), the counter-propagating light beams are typically highly coherent and circulate through multiple turns of the fiber optic coil and for multiple passes through the coil using a device, such as a fiber coupler, that redirects a portion of the light that has passed through the coil back into the coil again (i.e., circulates the light). The beam generating device modulates and/or shifts the frequencies of each of the counter-propagating light beams so that the resonance frequencies of the resonant coil may be observed. The resonance frequencies for each of the CW and CCW paths through the coil are based on a constructive interference condition such that all light-waves having traversed the coil a different number of times, are in phase, or add constructively, at any point in the coil. As a result of this constructive interference condition, an optical wave having a wavelength k is referred to as "on resonance" when the round-trip resonator optical pathlength is equal to an integral number of wavelengths. A rotation about the axis of the coil produces a different optical pathlength for clockwise and counterclockwise propagation, thus producing a shift between the respective resonance frequencies of the resonator, and the frequency difference, such as may be measured by tuning the CW beam and CCW beam frequencies to match the resonance frequency shift of the closed optical path due to rotation, indicates the rotation rate.

In some embodiments, the resonance frequency for the RFOG may be sensitive to temperature changes. For example, the resonance frequency of a gyroscope resonator may change roughly 2 GHz per degC of temperature change, whereas the laser frequency will change roughly 12 GHz per degC. The RFOG may maintain the various lasers at the desired resonant mode while accounting for the temperature dependent changes in resonance frequency. To maintain the laser at the desired resonant mode, the various lasers in the RFOG may be frequency tuned either by changing the injection current for the laser sources, or by changing the temperatures of the laser diodes.

SUMMARY

Systems and methods for performing resonator fiber optic gyroscope (RFOG) resonance hopping are described herein. For example, an RFOG includes a fiber optic resonator. The RFOG also includes a plurality of laser sources that each launch a respective laser for propagation within the fiber optic resonator. Further, the RFOG includes a threshold detector that determines when the operation of at least one laser source in the plurality of laser sources exceeds a threshold associated with the operational range of an aspect of the at least one laser source. Additionally, the RFOG includes a hop control logic that adjusts the frequency of at least one laser produced by the at least one laser source one or more resonant modes of the fiber optic resonator such that the aspect of the at least one laser moves away from the threshold towards a nominal value within the operational range.

DRAWINGS

Understanding that the drawings depict only some embodiments and are not therefore to be considered limiting in scope, the exemplary embodiments will be described with additional specificity and detail using the accompanying drawings, in which.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Systems and methods described herein use master laser resonance hopping to account for changes in temperature experienced by a resonator fiber optic gyroscope (RFOG). For example, an RFOG may monitor signals associated with the operation of laser sources for thresholds indicative of the operational range of the laser frequencies. When the signals pass a threshold value, the control loops for the laser may be opened and the frequency of the laser may be changed one or more free spectral ranges (FSR) of the resonator to align with different resonant modes, such that the signals associated with the laser sources are closer to the middle of the operational range of the laser sources. When the frequency of the laser has changed to the desired frequency, the control loops for the laser source may be closed so that the co-propagating lasers can track the resonance frequencies of the new resonant modes.

Figure 1:
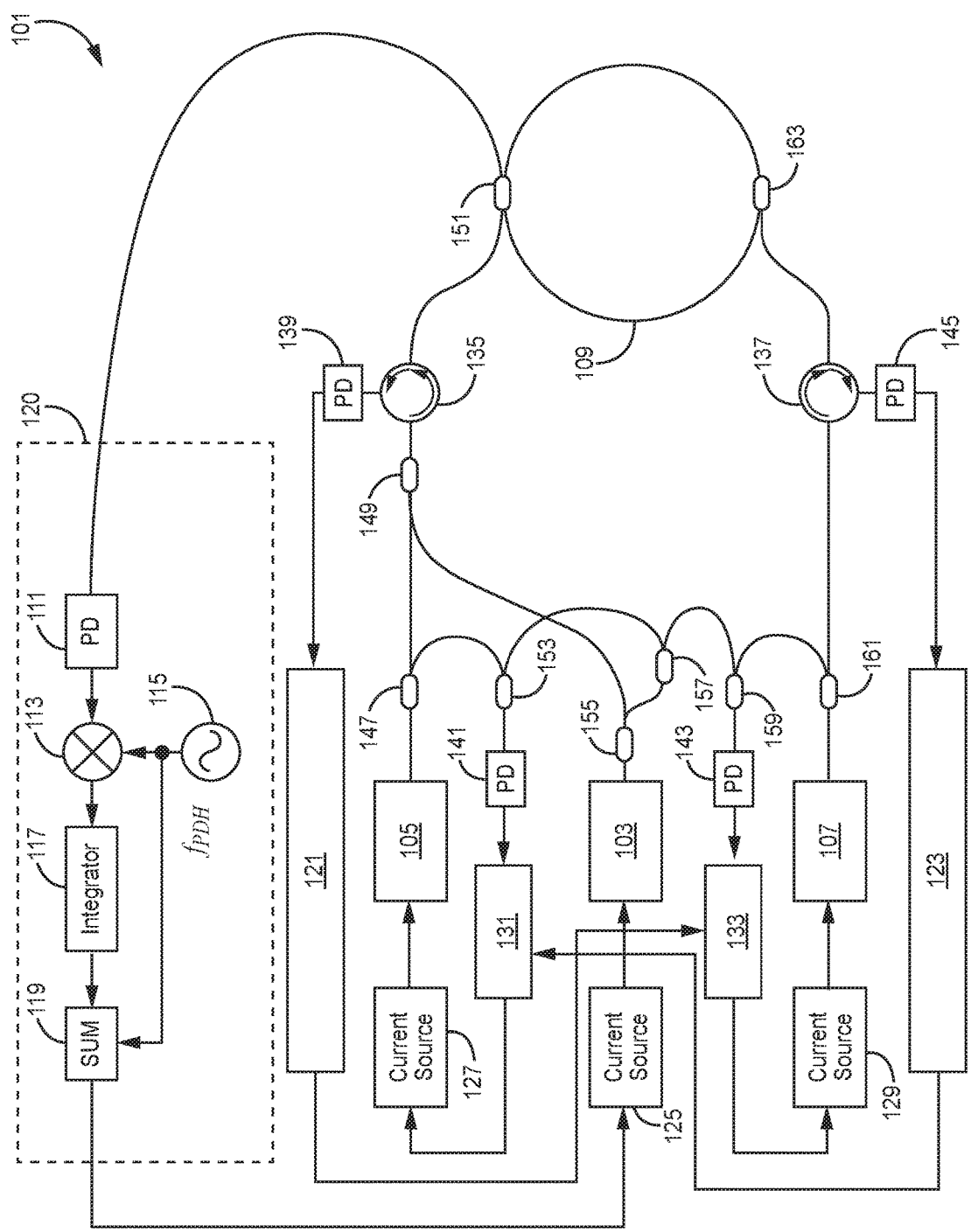
FIG. 1 is a block diagram illustrating an exemplary RFOG according to an aspect described in the present disclosure.

FIG. 1 is a block diagram of one embodiment of an RFOG 101 that uses a laser produced by a master laser source 103 to stabilize lasers produced by multiple slave laser sources 105 and 107 for propagation within a resonator 109. The RFOG 101 may function as part of a navigation system, a platform stabilization system, a pointing system, and the like. For example, in some embodiments, the RFOG 101 is implemented as part of an inertial sensor unit that includes one or more RFOGs and one or more linear accelerometers. The RFOG 101 may measure rotation rate and may output a signal indicative of the rotation rate. The measured rotation rate from the RFOG 101 may be provided to a processing unit or other computational device that uses the measured rotation rate when calculating parameters such as position, orientation, and angular velocity. Additionally, the calculated parameters may be used to calculate data to be included in control signals that are provided to one or more optional actuators for controlling the operation of the actuators.

Further, in at least one implementation, the RFOG 101 includes transmission and reflection mode feedback control. To provide transmission and reflection mode feedback control, light waves from the laser sources 103, 105, and 107 may circulate through the resonator 109. The lasers are coupled into the resonator 109 at ports 151 and 163 so that light can propagate within the resonator 109. In at least one implementation, the ports 151 and 163 include a mirror, a fiber optic coupler, waveguide, a waveguide coupler, or other suitable component for coupling light into the resonator 109. In at least one embodiment, the ports 151 and 163 function as both an input port and an output port. For example, the port 151 couples the light into the resonator 109 in a first direction (e.g., clockwise) and out of the resonator 109 in a second direction (e.g., counter-clockwise). Similarly, the port 163 couples the light into the resonator 109 in the second direction and out of the resonator 109 in the first direction. In alternative implementations, the resonator 109 may have separate input ports and output ports.

In some embodiments, light coupled into the resonator 109 has a "transmission port" and a "reflection port". In general, all the light detected at a transmission port has propagated through the resonator, whereas at the reflection port there is combination of the portion of the resonator incident light that did not enter the resonator 109 and light that has propagated through the resonator 109. For example, the port 163 functions as both a transmission port for the light coupled into the resonator 109 through the port 151 and as a reflection port for light incident on the resonator 109 at port 163. The port 151 functions as both a transmission port for the light coupled into the resonator 109 through the port 163 and as a reflection port for light incident on the resonator 109 at port 151.

In certain implementations, light that is coupled into the resonator 109 is frequency stabilized using the resonator 109 with feedback control based on light acquired from the transmission ports at ports 151 and 163. Further, in certain implementations where a light produced by a master laser source 103 is used to further stabilize the frequency of the light propagating within the resonator 109, light can also be acquired through the reflection port at port 151. Using feedback control, electromagnetic waves that propagate within the resonator 109, may be stabilized, at both high and low frequencies. Thus, stabilization over a wide bandwidth may be achieved.

In at least one implementation, feedback control may reduce laser phase noise using the Pound-Drever-Hall (PDH) technique. A laser source with PDH feedback control receives a signal from a PDH photodetector 111 that senses light from the reflection port 151 associated with a master laser source 103. The response to changes in relative frequency between light produced by a laser source and resonant frequency within the resonator 109 is much faster at the reflection port 151 than one of the transmission ports 151 and 163. To stabilize the laser produced by the master laser source 103 and, thus reduce the relative phase noise between the laser produced by the master laser source 103 and resonant frequency at the resonator 109, the light produced by the master laser source 103 is locked onto a CW resonance of the resonator 109 by using a PDH feedback control loop 120.

In certain embodiments, the low relative frequency noise between the light produced by the master laser source 103 and resonance frequency of the resonator 109 is transferred to the light produced by the slave laser sources 105 and 107 by employing phase locked loops 131 and 133. The phase locked loops 131 and 133 are configured to lock the light produced by the slave laser sources 105 and 107 to the light produced by the master laser source 103 with some additional frequency offset. To lock the light produced by the slave laser sources 105 and 107 to corresponding resonance frequencies of the resonator 109, transmission mode feedback control loops 121 and 123 may be used to lock the optical carriers of slave laser sources 105 and 107 to resonance centers (also referred to herein as simply "resonance") of the resonator 109. In some embodiments, the transmission mode feedback control loops 121 may be associated with the second slave laser source 107 and the transmission mode feedback control loop 123 may be associated with the first slave laser source 105, where the transmission mode feedback control loops 121 and 123 may receive signals from respective photodetectors 139 and 145, where the photodetector 139 receives light from the transmission port 151 and the photodetector 145 receives light from the transmission port 163. For example, when the RFOG 101 has a first slave laser source 105 producing a first slave laser and a second slave laser source 107 producing a second slave laser, the first slave laser may propagate in the CW direction and the second slave laser may propagate in the CCW direction in the resonator 109. As used herein, "CW" and "CCW" are terms to indicate that first slave laser and the second slave laser are propagating in opposite directions within the resonator 109. Additionally, a portion of the first slave laser and a portion of the second slave laser are coupled out of the resonator 109, where the respective transmission mode feedback control loops 123 and 121 determine adjustments to be made by the slave laser sources 105 and 107 to change the frequencies of the slave lasers such that the slave lasers propagate within the resonator 109, on a resonance of the resonator, at the center frequency of the resonant mode of the resonator 109.

In some embodiments, employing high frequency phase modulation referred to as Sideband Heterodyne Detection modulation, the first order modulation sidebands are locked to resonance centers whereas the laser optical carrier is locked off resonance and in the middle of the free spectral range between two resonance peaks. Henceforth, locking a laser onto a resonance mode, on a resonance, or at the center frequency of the resonant mode, can mean locking the optical carrier to a resonance center or locking first order modulation sidebands to resonance centers.

The first slave laser, propagating in the CW direction, may be coupled out of the resonator 109 by a coupler that functions as a transmission port 163 and passed to a circulator 137, where the circulator 137 circulates the first slave laser to be detected by the photodetector 145. The photodetector 145 may provide an electrical signal to CW resonance tracking electronics in the CW transmission mode feedback control loop 123. The CW resonance tracking electronics may track departures of the frequency of the first slave laser from the center frequency of resonant modes of the resonator 109 and provide a signal to the CW phase locked loop 131 indicative of the departure from resonance. The CW phase locked loop 131 may provide a signal to the current source 127 that adjusts the drive current for the first slave laser source 105 such that the frequency of the first laser moves closer to a resonance center frequency of the resonant mode of the resonator 109.

Similarly, the second slave laser may propagate in the CCW direction and a portion of the second slave laser may be coupled out of the resonator 109 by a coupler that functions as a transmission port 151. The coupler at the transmission port 151 may couple a portion of the second slave laser propagating within the resonator 109 out of the resonator 109 and pass the portion of the second slave laser to a circulator 135. The circulator 135 may receive the portion of the second slave laser from the transmission port 151 and provide the portion for detection by a photodetector 139 coupled to the circulator 135. The photodetector 139 may detect the second slave laser and may provide an electrical signal to CCW resonance tracking electronics in the CCW transmission mode feedback control loop 121. The CCW resonance tracking electronics may track departures of the frequency of the second slave laser from the center frequency of a resonant mode of the resonator 109 and provide a signal to the CCW phase locked loop 133 indicative of the departure from resonance. The CCW phase locked loop 133 may provide a signal to the current source 129 that adjusts the drive current for the second laser source 107 such that the frequency of the second laser moves closer to a resonant mode of the resonator 109.

In certain implementations, where light produced by a master laser source 103 is controlled through PDH feedback, the light output by the master laser source 103 may be coupled with light produced by multiple slave laser sources 105 and 107 through couplers 155, 157, 153 and 159. For example, the master laser source 103 provides light to the coupler 155. The coupler 155 provides a portion of the light for circulation within the resonator 109 and another portion of the light to the coupler 157. The coupler 157 provides a portion of the light to the coupler 153 and another portion of the light to the coupler 159. The coupler 153 couples together a portion of the master laser from the coupler 157 along with a portion of the first slave laser and provides the combined light to the CW phase locked loop 131. Similarly, the coupler 159 couples together a portion of the master laser from the coupler 157 along with a portion of the second slave laser and provides the combined light to the CCW phase locked loop 133.

Further, the output of the master laser source 103 is coupled into the resonator 109 through couplers 155 and 149. The master laser source 103 is configured to generate light for propagation within the resonator 109. The light produced by the master laser source 103 receives PDH feedback through the PDH feedback control loop 120 for locking the frequency of the light from the master laser source 103 to the resonator 109 resonance. For example, the PDH feedback control loop 120 may include a PDH photodetector 111 that receives light from the reflection port 151 of the resonator 109. The PDH feedback control loop 120 is further coupled to the master laser source 103 via the current source 125, where the current source 125 frequency modulates the light from the master laser source 103 at a PDH modulation frequency 115.

In some embodiments, the PDH feedback control loop 120 may include a demodulator 113. In particular, the PDH photodetector 111, in the PDH feedback control loop 120, detects output from the reflection port 151 and provides an electrical signal to the demodulator 113. The demodulator 113 demodulates the signal at the PDH modulation frequency 115 and provides the demodulated signal to an integrator 117. The integrator 117 identifies departures of the master laser from resonant modes of the resonator 109 and provides a signal that adjusts the drive current of the master laser source 103. The signal provided by the integrator 117 is then summed with a signal representing the PDH modulation frequency 115 by the summer 119 before driving the current source 125 to adjust the frequency of the light produced by the master laser source 103 to be at a resonant mode of the resonator 109.

In certain embodiments, the RFOG 101 is sensitive to temperature changes. In particular, the resonant frequency of the resonator 109 may change roughly 2 GHz per degC of temperature change and the laser frequency will change roughly 12 GHz per degC. With minor temperature changes, the RFOG 101 may capably maintain the various lasers at the desired resonant mode while accounting for the temperature dependent changes in resonant frequency. To maintain the lasers at the desired resonant modes, the various lasers in the RFOG 101 may be frequency tuned either by changing the injection current for the laser sources, or by changing the temperatures of the laser diodes.

However, with large environmental temperature changes, the RFOG 101 may experience difficulties in compensating for the effects of the temperature changes. Sometimes, to compensate for the temperature changes, thermoelectric coolers may be used to change the temperatures of the various components in the RFOG 101. However, thermoelectric coolers are expensive, increase the size of the RFOG 101, and use a substantial amount of electrical power to operate. Alternatively, the resonance shift due to resonator temperature change may be compensated for by changing the injection current of the laser sources, to move the lasers closer to resonance. However, the laser tuning range is similarly limited. In part, changing the injection current of the master laser source 103, may result in a limited frequency tuning range where the master laser performance is acceptable. For example, a diode laser may have a mode-hop free single frequency tuning range of roughly 1 to 2 GHz. Therefore, the laser performance may become unacceptable when the temperature of the RFOG 101 changes by more than about 1 to 2 degC. Thus, when an RFOG 101 operates in environments that change by 80 degC or more, the temperature changes pose a problem for the operation of the RFOG 101.

Figure 2:
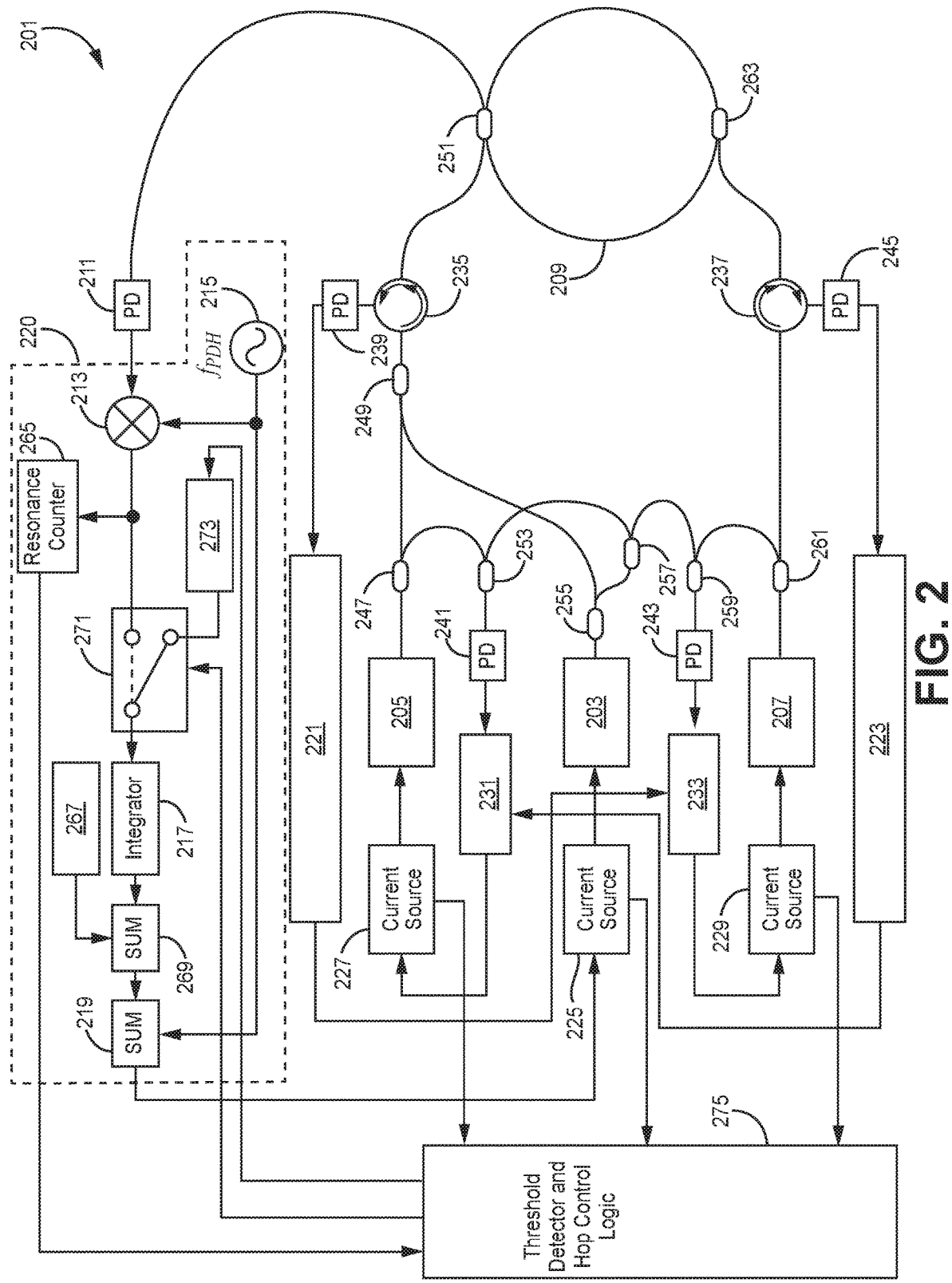
FIG. 2 is a block diagram illustrating an exemplary RFOG that implements resonance hopping according to an aspect of the present disclosure.

FIG. 2 is a diagram illustrating an RFOG 201 implementing resonance hopping to address changes in temperature to the different components of the RFOG 201. The RFOG 201 functions substantially similar to the RFOG 101 described above in FIG. 1. However, the RFOG 201 includes a threshold detector and hop control logic 275, a resonance counter 265, a first offset 267, an offset summer 269, a hop switch 271, and a second offset 273. Other components of the RFOG 201 function substantially as described above in FIG. 1.

In certain embodiments, to respond to changes in temperature that cause the current resonant mode to shift outside the operable range of one or more of the lasers produced by the laser sources 203, 205, and 207, the RFOG 201 may include circuitry that forces the master laser to hop a number of gyro resonance modes (either up or down in frequency) to keep the signals produced by the laser control loops within ranges that drive the lasers produced by the laser sources 203, 205, and 207 within the operating range of the lasers. Additionally, the lasers are driven such that the lasers are maintained within their own single frequency region.

During a "resonance hop" (changing of lasers frequency by one or more FSR of the resonator) and the subsequent time used by the loops to lock the lasers to the new resonant modes, the data produced by the RFOG 201 may be corrupted. Therefore, the resonance hop may occur quickly to reduce the impact of the resonance hop to the system using the RFOG 201. Besides quickly performing the resonance hop, the resonance hop may be performed in such a way to reduce the amplitude of error transients caused by the hop. For example, data produced by the RFOG 201 may be ignored during the performance of a resonance hop.

In some embodiments, a control loop associated with a laser source 203, 205, and 207 (such as a control loop within a multi-frequency laser source), may approach a predetermined threshold, where the predetermined threshold indicates that operation of the control loop is approaching an operating limit for the control loop (but the operation of the control loop is still within the operational range). When a control loop reaches the threshold, the master laser source 203 may be directed to drive the master laser to hop a number of resonances in a direction that results in the operation of the control loop moving away from the crossed threshold towards the middle of the operational range of the control loop.

In certain embodiments, where the control loops control master and slave injection currents to keep the laser frequency equal to a resonance frequency of a resonant mode of the resonator 209, the injection currents may be monitored to determine when the operating range of the control loops exceeds a predetermined threshold. Alternatively, control loops may be temperature control loops that keep the laser injection current at a nominal value by tuning the laser frequency by changing the temperature of the laser sources.

In certain embodiments, when an aspect of a particular control loop crosses a threshold, the PDH control loop 220 for the master laser source 203 may be opened, and the master laser injection current provided by the master current source 225 may be ramped in a direction that moves the frequency of the master laser towards a resonance frequency of a resonance mode of the resonator 209, such that once the master laser is locked onto that mode, the control loop operates near the middle of the operating range for the control loop. In some embodiments, where the slave lasers produced by the slave laser sources 205 and 207 are phase locked to the master laser produced by the master laser source 203, the first slave laser and the second slave laser may follow the master laser to resonance modes that cause the associated control loops to operate near the middle of the operating range for the control loops and laser sources 203, 205, and 207. In some implementations, where the slave lasers are not phase locked to the master laser, the control loops for the slave laser sources 205 and 207 may be opened and the current sources 227 and 229 may be ramped in a direction that moves the frequency of the slave lasers produced by the slave laser sources 205 and 207 towards resonance frequencies of resonance modes of the resonator 209, such that, once the slave lasers are locked onto the respective modes, the control loops for the slave laser sources 205 and 207 operate near the middle of the operating range for the control loops and the slave laser sources 205 and 207.

In some embodiments, when circuitry forces a resonant hop for the master laser source 203, the circuitry may force the resonant mode to hop by a predetermined number of resonance modes. In some implementations, to control the number of resonance modes hopped by the master laser, the RFOG 201 may count the number of resonant modes hopped by the master laser. For example, the PDH control loop 220 may include a detection circuit that outputs a digital pulse when a signal within the PDH control loop 220 passes through a resonant mode when the operation of the master laser source 203 changes.

In certain implementations, the RFOG 201 may include multiple offset values to control which resonant mode of the resonator 209 that the master laser source 203 locks to. For example, the RFOG 201 may include a first offset 267 and a second offset 273. The first offset 267 is a value indicative of the middle of the normal operating range of the master injection current provided by the master current source 225 or some other aspect of the operation of the master laser source 203. The second offset 273 may be a value that is controlled by a threshold detector and hop control logic 275 to change the injection current for the master laser source 203 when performing resonance hops back towards the first offset 267. Accordingly, at startup of the RFOG 201, a hop switch 271 may be in the opened position, the second offset 273 may be set to zero and the first offset 267 may be set to a value that causes the master injection current provided by the master current source 225 to be at a nominal starting value that is expected to be in the middle of the normal operating range for the master current source 225. Then the switch is commanded by the threshold detector and hop control logic 275 to move into the closed position. The PDH control loop 220 may then control the master current source 225 to change the injection current such that the frequency of light provided by the master laser source 203 moves to and remains at a resonance mode for the resonator 209 as the output of the demodulator 213 provides a control loop error signal to the integrator 217, which also provides a control signal to the master current source 225 to control the master laser frequency to remain on resonance.

As discussed above, changes in the temperature of the RFOG 201 may also lead to changes in the resonance frequency for the resonator 209. To keep the frequency of the master laser at a resonant mode, the PDH control loop 220 may direct the master current source 225 to change the injection current provided to the master laser source 203 such that the frequency of the master laser follows the resonant frequency of the resonator 209 of the RFOG 201. Additionally, the optical phase lock loops 231 and 233 may also change the slave injection currents provided by the current sources 227 and 229 to keep the slave lasers provided by the slave laser sources 205 and 207 on their respective resonance modes for the resonator 209.

In certain embodiments, the threshold detector and hop control logic 275 may monitor the injection current for the three laser sources 203, 205, and 207. When the injection current for one of the laser sources crosses a predetermined threshold, as discussed above, the threshold detector and hop control logic 275 may send an offset value to the second offset 273. Also, the threshold detector and hop control logic 275 may direct the hop switch 271 to switch from a closed position to the open, ramp position. When the hop switch 271 is in the open position, the integrator 217 receives a signal from the second offset 273 as an input in contrast to the signal from the demodulator 213 when the switch is in the closed position. Accordingly, the integrator 217 may output a signal that ramps with a direction and speed depending on the sign and magnitude of the second offset 273. As the output of the integrator 217 ramps the master laser injection current, the frequency of the laser provided by the master laser source 203 ramps accordingly.

In some embodiments, during the ramping of the frequency of the master laser, a resonance counter 265, coupled to the output of the demodulator 213 may count the number of resonance modes through which the frequency of the master laser transitions by detecting when the output of the demodulator 213 indicates that the master laser is passing through a resonance mode. In some implementations, the resonance counter 265 provides a signal to the threshold detector and hop control logic 275 that indicates the number of resonance modes through which the frequency of the master laser has transitioned. When the signal received from the resonance counter 265 indicates that the frequency of the master laser has transitioned through a specified number of resonance modes (or free spectral ranges), the threshold detector and hop control logic 275 may command the hop switch 271 to switch the PDH control loop 220 back to a closed mode. Accordingly, the PDH loop may lock the frequency of the master laser back to a new resonant mode of the resonator 209.

In some embodiments, the threshold detector and hop control logic 275 may determine the direction of the master injection current ramp, the sign of the second offset 273, by identifying the direction that would move the master injection current back towards the nominal starting value associated with the first offset 267. The number of resonance modes (free spectral ranges) through which the frequency of the master laser hops may be such that, upon completion of the hop, the injection current provided by the master current source 225 is near or closer to the nominal starting value. If the injection current provided by the master current source 225 is closer to but not at the nominal starting value, the threshold detector and hop control logic 275 may direct the performance of multiple resonance hops to move the injection current provided by the master current source 225 back to near the nominal starting value. In some embodiments, the number of resonance modes hopped in single resonance hop, and the number of resonance hops performed to move the injection current provided by the master current source 225 back to near the nominal starting value may depend on how the resonance hops impact the performance of the RFOG 201.

Figure 3:
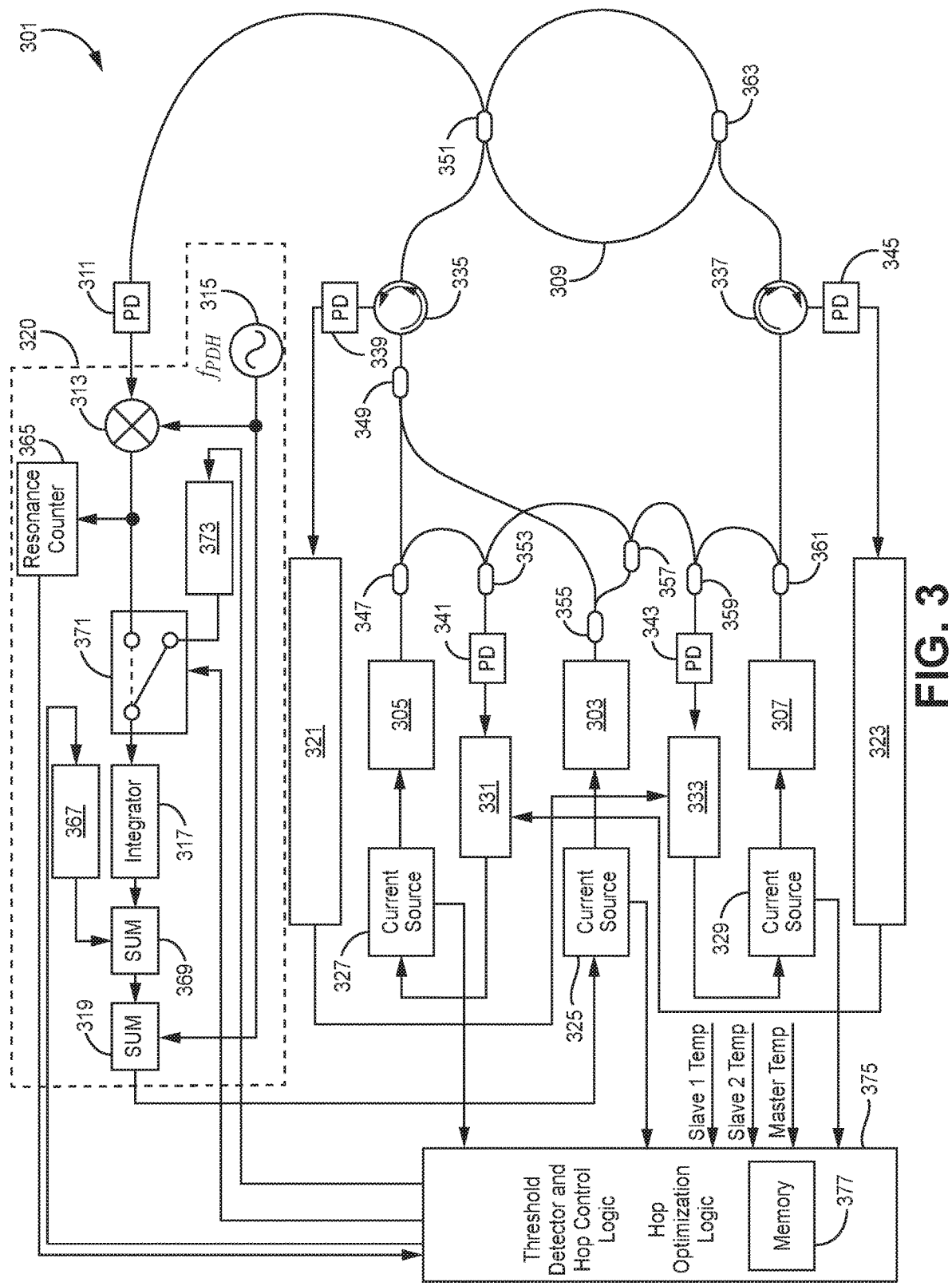
FIG. 3 is a block diagram illustrating an exemplary RFOG that implements resonance hopping having a digital memory according to an aspect of the present disclosure.

FIG. 3 is a block diagram of an RFOG 301 that performs resonance hopping as described above with respect to the RFOG 201 in FIG. 2 but additionally includes a digital memory 377 to store information related to resonance hopping. For example, in addition to the methods described above for resonance hopping in FIG. 2, the threshold detector and hop control logic 375 may include a memory 377 that is used by a hop optimization logic within the threshold detector and hop control logic 375 to determine how much to change the injection current provided by the master current source 325 during a resonance hop. For example, the memory 377 may store the amount of change to the injection current provided by the master current source 325 that moves the frequency of the master laser a number of resonance modes (free spectral ranges) of the resonator 309 for the RFOG 301. The threshold detector and hop control logic 375 may obtain initial values for storing in the memory 377 during calibration testing during production of the RFOG 301. The threshold detector and hop control logic 375 may update the values during normal operation of the RFOG 301.

As described above, when the threshold detector and hop control logic 375 decides to perform a resonance hop, the PDH loop for the master laser source 303 may be opened. The threshold detector and hop control logic 375 may determine a ramp value for the second offset 373 based on information stored in the digital memory 377.

In some embodiments, when the injection current provided by the master current source 325 reaches the new value, the switch 371 in the PDH control loop 320 may be closed. If the value in the memory 377 does not move the frequency of the master laser an integer number of free spectral ranges, then when the PDH control loop 320 is closed, the injection current provided by the master current source 325 may then quickly converge to a slightly different value than the value stored in memory. When the injection current provided by the master current source 325 converges, the threshold detector and hop control logic 375 may then update the information stored in the memory 377 with the injection current to which the PDH control loop 320 converged. The memory 377 may contain multiple injection current values based on the injection current values before the hop is initiated. Alternatively, the threshold detector and hop control logic 375 may calculate a new injection current value based on the present injection current value, values for the injection current stored in memory, other laser parameters such as temperature of the laser sources 303, 305, and 307, and measured resonator free spectral ranges or temperature of the resonator 309. The use of the memory 377 may be combined with the use of resonance counting to improve the accuracy of the resonance of the hop. By improving the accuracy of the hop, the amount of time used to converge on a resonant mode by the PDH control loop 320 after the switch 371 is closed may be reduced.

In additional embodiments, the scale factor for the RFOG 301 (where the scale factor is used to convert the gyro digital output word to a rotation angle) may depend on the resonance modes that the slave lasers are locked onto. Since the slave lasers are locked a constant number of resonator free-spectral-ranges away from the master laser, the scale factor of the RFOG 301 depends on the resonance mode that the master laser is locked onto. For an improved scale factor performance of the RFOG 301, it may be desirable to store information related to the number of resonance modes or free-spectral-range passed during a resonance hop.

In some embodiments, after a resonance hop has been initiated, the threshold detector and hop control logic 275 may decide when to stop the ramp of the master injection current and close the PDH control loop 320 based on the number of passing resonances detected, the measured master injection current, or both. The threshold detector and hop control logic 275 may decide to stop the ramp and close the PDH loop such that, when the PDH loop is closed, the frequency of the master laser is close to the desired resonance mode. If the master frequency is too far away from the desired resonance mode, then the PDH loop may lock onto a resonance mode other than the desired mode. When this happens, an error in counting the number of actual resonances hopped may occur.

In further embodiments, the hop optimization logic executed by the threshold detector and hop control logic 375 may use past laser current and temperature measurements stored in memory along with current laser current and temperature measurements, combined with a model to predict the optimum time when to stop the master injection current ramp and close the PDH loop to ensure that the master laser relocks onto the desired resonance mode.

Additionally, to prevent the effects that resonance hopping has on the measurements provided by the RFOG 301, the RFOG 301 may attempt to coordinate the execution of resonance hops with the execution of other events that would cause the RFOG 301 to stop providing measurements for a period of time. For example, when an RFOG 301 performs resonance switching (periodically switching the resonant modes of the first slave laser with the resonant modes of the second slave laser), the threshold detector and hop control logic 375 may attempt to coordinate the resonance hop with the resonance switch as both resonance hops and switches cause a short and temporary glitch in the data provided by the RFOG 301. By coordinating the resonance hops and switches, such that a resonance hop is performed with a resonance switch, the number and frequency of glitches in the data provided by the RFOG 301 may be reduced. Resonance switching is further discussed in U.S. Pat. No. 9,772,189, titled "SYSTEMS AND METHODS FOR RESONANCE SWITCHING RESONATOR FIBER OPTIC GYROSCOPES (RFOGS) WITH FEED-FORWARD PROCESSING," which is incorporated herein by reference.

In some embodiments, there may be some control loops within the RFOG 301 that may be opened during a resonance hop and closed once the resonance hop is completed. For example, control loops that control the average optical power at the resonator outputs are typically much slower than the PDH control loop 320. A resonance hop may produce a glitch in the error signal of optical power control loops. Since these loops are slow, a fast glitch will be spread out by the control loop, thus resulting in the average optical power deviating from the desired level for a significant amount of time. By opening the power control loop during a resonance hop, and possibly setting the power to a fixed value (close to the value before opening the loop) the glitch can be ignored by the control loop, or it's affect is minimized.

In certain embodiments, the threshold detector and hop control logic 375 (and 275) may include a processing unit or other computational device found within the RFOG 301, outside the RFOG 301, or other combination thereof. The processing unit may be implemented using software, firmware, hardware, or other appropriate combination thereof. The processing unit and/or other computational devices may be supplemented by, or incorporated in, specially-designed application-specific integrated circuits (ASICs) or field programmable gate arrays (FPGAs). The processing unit and other computation devices may also include or function with software programs, firmware, or other computer readable instructions for carrying out various process tasks, calculations, and control functions used in the present methods and systems.

Further, the methods described herein may be implemented by computer executable instructions such as program modules or components, which are executed by at least one processing unit. Generally, program modules include routines, programs, objects, data components, data structures, algorithms, and the like, which perform particular tasks or implement particular abstract data types. Instructions for carrying out various process tasks, calculations, and generation of the other data used in the operations of the methods described herein may be implemented in software, firmware, or other computer readable instructions. These instructions are typically stored on any appropriate computer program product that includes a computer-readable medium used for storage of computer-readable instructions or data structures. The computer-readable medium may be any available media that can be accessed by a general purpose or special purpose computer or processor or any programmable logic device. In certain implementations, the computer readable medium may be stored on the memory 377.

Suitable computer-readable storage media, such as that found as part of the memory 377, may include, for example, non-volatile memory devices including semi-conductor memory devices such as random access memory (RAM does print, read-only memory (ROM), electrically erasable programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer executable instructions or data structures.

Figure 4:
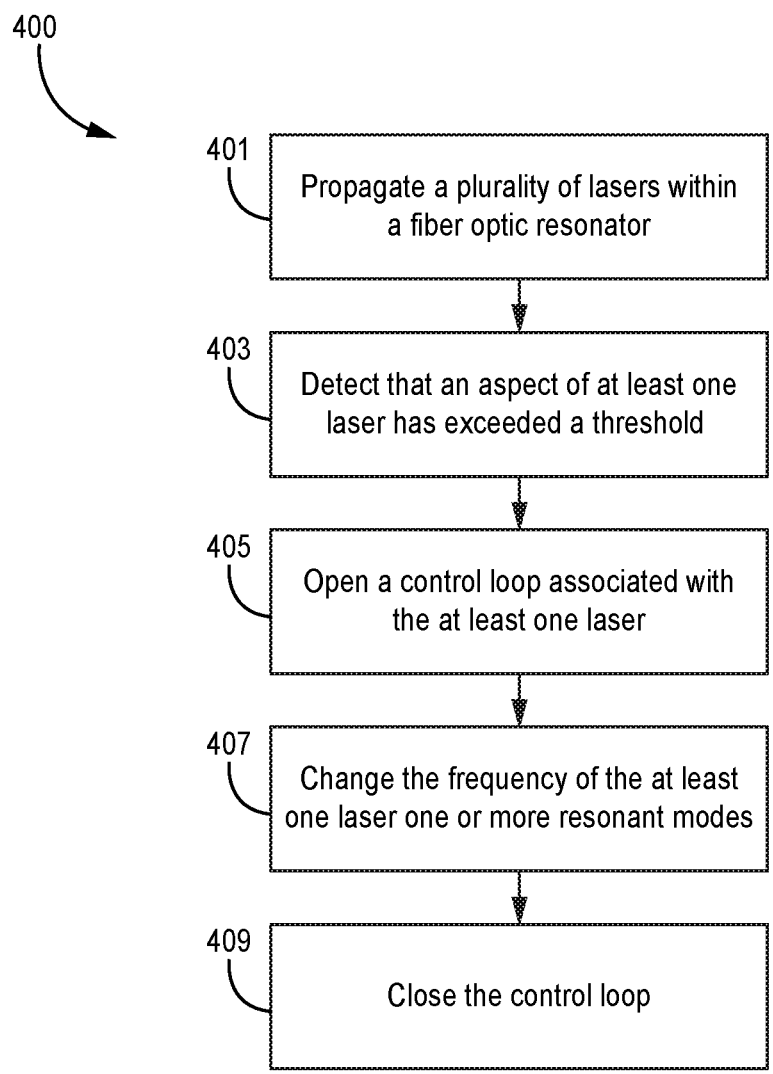
FIG. 4 is a flowchart diagram illustrating a method 400 for resonance mode hopping according to an aspect of the present disclosure.

FIG. 4 is a flow chart diagram of a method 400 for performing resonant mode hopping within an RFOG, such as RFOGs 201 and 301 described above. Method 400 proceeds at 401, where a plurality of lasers propagate within a fiber optic resonator. For example, several lasers may propagate within a resonator in opposite directions, where a plurality of control loops respectively associated with the lasers may control the respective frequency for the plurality of lasers to be at resonant modes of the fiber optic resonator. Further, the method 400 may proceed at 403, where whether an aspect of at least one laser has exceeded a threshold is detected. For example, where the aspect of the laser is the injection current that drives the laser, the current may be monitored to detect whether or not the current has passed a threshold within the operational range of the current source.

In further embodiments, the method 400 may proceed at 405, where a control loop associated with the at least one laser is opened. For example, where the laser is a master laser, such as a master laser produced by the master laser sources 203 or 303, the PDH control loop (220 or 320) may be opened. When the control loop is opened, the method 400 may proceed at 407, where the frequency of the at least one laser changes one or more resonant modes. For example, hop control logic may direct the frequency of the laser to hop one or more resonant modes such that the injection current for the laser moves away from the threshold towards a nominal value within the operational range of the current source providing the injection current for the laser. When the frequency of the laser has hopped, the method 400 may proceed at 409, where the control loop is closed. The control loop closes the frequency of the laser may lock to a resonant mode of the fiber optic resonator.

Example Embodiments

Example 1 includes a resonator fiber optic gyroscope (RFOG) comprising: a fiber optic resonator; a plurality of laser sources that each launch a respective laser for propagation within the fiber optic resonator; a threshold detector that determines when the operation of at least one laser source in the plurality of laser sources exceeds a threshold associated with the operational range of an aspect of the at least one laser source; and a hop control logic that adjusts the frequency of at least one laser produced by the at least one laser source one or more resonant modes of the fiber optic resonator such that the aspect of the at least one laser moves away from the threshold towards a nominal value within the operational range.

Example 2 includes the RFOG of Example 1, wherein the hop control logic further: directs one or more control loops for the at least one laser to open when the frequency of the at least one laser is adjusted; and directs the one or more control loops to close when frequency of the at least one laser is associated with the operational range of the aspect of the at least one laser.

Example 3 includes the RFOG of Example 2, wherein a control loop in the one or more control loops is a Pound Dreyer Hall control loop.

Example 4 includes the RFOG of any of Examples 1-3, wherein the aspect of the at least one laser sources comprises at least one of: a current provided to the at least one laser source; a temperature associated with the at least one laser source; and a frequency of light produced by the at least one laser source.

Example 5 includes the RFOG of any of Examples 1-4, comprising a first offset configured to provide a nominal starting value for the aspect of the at least one laser source.

Example 6 includes the RFOG of any of Examples 1-5, comprising a second offset set by the hop control logic, wherein the hop control logic sets the second offset to the nominal value for the aspect of the at least one laser source.

Example 7 includes the RFOG of any of Examples 1-6, wherein the hop control logic comprises a memory that stores information associated with the adjustments of the frequency of the at least one laser over the one or more resonant modes of the fiber optic resonator.

Example 8 includes the RFOG of Example 7, wherein the information stored in the memory comprises: temperature information; current information; the number of resonant modes through which the frequency of the at least one laser was adjusted; and frequency information.

Example 9 includes a method comprising: propagating a plurality of lasers within a fiber optic resonator, wherein a plurality of control loops respectively associated with the plurality of lasers controls the respective frequency for the plurality of lasers to be at a resonant mode of the fiber optic resonator; detecting that an aspect of at least one laser in the plurality of lasers has exceeded a threshold within the operational range of the aspect of the at least one laser; opening a control loop in the plurality of control loops associated with the at least one laser; change the frequency of the at least one laser one or more resonant modes such that the aspect of the at least one laser moves away from the threshold towards a nominal value within the operational range; and closing the control loop such that the frequency of the at least one laser locks on a resonant frequency of the fiber optic resonator.

Example 10 includes the method of Example 9, wherein the control loop is a Pound Dreyer Hall control loop.

Example 11 includes the method of any of Examples 9-10, wherein the aspect of the at least one laser source comprises at least one of: a current provided to the at least one laser source; a temperature associated with the at least one laser source; and a frequency of light produced by the at least one laser source.

Example 12 includes the method of any of Examples 9-11, further comprising setting the aspect of the at least one laser to a first offset that provides a nominal starting value for the aspect of the at least one laser source.

Example 13 includes the method of any of Examples 9-12, wherein the nominal value is dictated by a second offset.

Example 14 includes the method of Example 13, wherein the second offset is controlled by a hop control logic.

Example 15 includes the method of any of Examples 9-14, further comprising storing information associated with the adjustments of the frequency of the at least one laser over the one or more resonant modes of the fiber optic resonator in memory.

Example 16 includes the method of Example 15, wherein the information stored in the memory comprises: temperature information; current information; the number of resonant modes through which the frequency of the at least one laser was adjusted; and frequency information.

Example 17 includes a system comprising: a fiber optic resonator; a plurality of laser sources that each launch a respective laser for propagation within the fiber optic resonator; one or more control loops that change the frequency of the respective lasers produced by the plurality of laser sources to stay on resonant modes of the fiber optic resonator; a threshold detector that determines when the operation of at least one laser source in the plurality of laser sources exceeds a threshold associated with the operational range of an aspect of the at least one laser source; and a hop control logic that adjusts the frequency of at least one laser produced by the at least one laser source one or more resonant modes of the fiber optic resonator such that the aspect of the at least one laser moves away from the threshold towards a nominal value within the operational range.

Example 18 includes the system of Example 17, wherein the hop control logic further: directs the one or more control loops for the at least one laser to open when the frequency of the at least one laser is adjusted; and directs the one or more control loops to close when frequency of the at least one laser is associated with the operational range of the aspect of the at least one laser.

Example 19 includes the system of any of Examples 17-18, comprising: a first offset configured to provide a nominal starting value for the aspect of the at least one laser source, a second offset set by the hop control logic, wherein the hop control logic sets the second offset to the nominal value for the aspect of the at least one laser source.

Example 20 includes the system of any of Examples 17-19, wherein the hop control logic comprises a memory that stores information associated with the adjustments of the frequency of the at least one laser over the one or more resonant modes of the fiber optic resonator.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A resonator fiber optic gyroscope (RFOG) comprising:
   a fiber optic resonator;
   a plurality of laser sources that each launch a respective laser for propagation within the fiber optic resonator;
   a threshold detector that determines when the operation of at least one laser source in the plurality of laser sources exceeds a threshold associated with the operational range of an aspect of the at least one laser source; and
   a hop control logic that adjusts the frequency of at least one laser produced by the at least one laser source one or more resonant modes of the fiber optic resonator such that the aspect of the at least one laser moves away from the threshold towards a nominal value within the operational range.

2. The RFOG of claim 1, wherein the hop control logic further:
   directs one or more control loops for the at least one laser to open when the frequency of the at least one laser is adjusted; and
   directs the one or more control loops to close when frequency of the at least one laser is associated with the operational range of the aspect of the at least one laser.

3. The RFOG of claim 2, wherein a control loop in the one or more control loops is a Pound Dreyer Hall control loop.

4. The RFOG of claim 1, wherein the aspect of the at least one laser sources comprises at least one of:
- a current provided to the at least one laser source;
- a temperature associated with the at least one laser source; and
- a frequency of light produced by the at least one laser source.

5. The RFOG of claim 1, comprising a first offset configured to provide a nominal starting value for the aspect of the at least one laser source.

6. The RFOG of claim 1, comprising a second offset set by the hop control logic, wherein the hop control logic sets the second offset to the nominal value for the aspect of the at least one laser source.

7. The RFOG of claim 1, wherein the hop control logic comprises a memory that stores information associated with the adjustments of the frequency of the at least one laser over the one or more resonant modes of the fiber optic resonator.

8. The RFOG of claim 7, wherein the information stored in the memory comprises:
- temperature information;
- current information;
- the number of resonant modes through which the frequency of the at least one laser was adjusted; and
- frequency information.

9. A method comprising:
- propagating a plurality of lasers within a fiber optic resonator, wherein a plurality of control loops respectively associated with the plurality of lasers controls the respective frequency for the plurality of lasers to be at a resonant mode of the fiber optic resonator;
- detecting that an aspect of at least one laser in the plurality of lasers has exceeded a threshold within the operational range of the aspect of the at least one laser;
- opening a control loop in the plurality of control loops associated with the at least one laser;
- change the frequency of the at least one laser one or more resonant modes such that the aspect of the at least one laser moves away from the threshold towards a nominal value within the operational range; and
- closing the control loop such that the frequency of the at least one laser locks on a resonant frequency of the fiber optic resonator.

10. The method of claim 9, wherein the control loop is a Pound Dreyer Hall control loop.

11. The method of claim 9, wherein the aspect of the at least one laser source comprises at least one of:
- a current provided to the at least one laser source;
- a temperature associated with the at least one laser source; and
- a frequency of light produced by the at least one laser source.

12. The method of claim 9, further comprising setting the aspect of the at least one laser to a first offset that provides a nominal starting value for the aspect of the at least one laser source.

13. The method of claim 9, wherein the nominal value is dictated by a second offset.

14. The method of claim 13, wherein the second offset is controlled by a hop control logic.

15. The method of claim 9, further comprising storing information associated with the adjustments of the frequency of the at least one laser over the one or more resonant modes of the fiber optic resonator in memory.

16. The method of claim 15, wherein the information stored in the memory comprises:
- temperature information;
- current information;
- the number of resonant modes through which the frequency of the at least one laser was adjusted; and
- frequency information.

17. A system comprising:
- a fiber optic resonator;
- a plurality of laser sources that each launch a respective laser for propagation within the fiber optic resonator;
- one or more control loops that change the frequency of the respective lasers produced by the plurality of laser sources to stay on resonant modes of the fiber optic resonator;
- a threshold detector that determines when the operation of at least one laser source in the plurality of laser sources exceeds a threshold associated with the operational range of an aspect of the at least one laser source; and
- a hop control logic that adjusts the frequency of at least one laser produced by the at least one laser source one or more resonant modes of the fiber optic resonator such that the aspect of the at least one laser moves away from the threshold towards a nominal value within the operational range.

18. The system of claim 17, wherein the hop control logic further:
- directs the one or more control loops for the at least one laser to open when the frequency of the at least one laser is adjusted; and
- directs the one or more control loops to close when frequency of the at least one laser is associated with the operational range of the aspect of the at least one laser.

19. The system of claim 17, comprising:
- a first offset configured to provide a nominal starting value for the aspect of the at least one laser source,
- a second offset set by the hop control logic, wherein the hop control logic sets the second offset to the nominal value for the aspect of the at least one laser source.

20. The system of claim 17, wherein the hop control logic comprises a memory that stores information associated with the adjustments of the frequency of the at least one laser over the one or more resonant modes of the fiber optic resonator.

* * * * *